(12) United States Patent
Berg (10) Patent No.: US 12,170,508 B2
(45) Date of Patent: Dec. 17, 2024

(54) AMPLIFIER CIRCUIT FOR AMPLIFYING SINUSOID SIGNALS

(71) Applicant: Sivers Wireless AB, Kista (SE)

(72) Inventor: Håkan Berg, Harestad (SE)

(73) Assignee: Sivers Wireless AB (SE)

( * ) Notice: Subject to any disclaimer, the term of this patent is extended or adjusted under 35 U.S.C. 154(b) by 201 days.

(21) Appl. No.: 18/077,928

(22) Filed: Dec. 8, 2022

(65) Prior Publication Data

US 2023/0198477 A1  Jun. 22, 2023

(30) Foreign Application Priority Data

Dec. 22, 2021  (EP) .................................... 21216735

(51) Int. Cl.
| | |
|---|---|
| *H03D 7/12* | (2006.01) |
| *H03D 7/18* | (2006.01) |
| *H03F 3/19* | (2006.01) |
| *H03F 3/193* | (2006.01) |

(52) U.S. Cl.
CPC ............. *H03F 3/193* (2013.01); *H03D 7/125* (2013.01); *H03D 7/18* (2013.01); *H03F 2200/336* (2013.01); *H03F 2200/451* (2013.01)

(58) Field of Classification Search
CPC . H03D 7/12; H03D 7/125; H03D 7/18; H03F 2200/336; H03F 2200/451; H03F 3/19; H03F 3/193

USPC ......................................... 327/355, 356, 357
See application file for complete search history.

(56) References Cited

U.S. PATENT DOCUMENTS

| | | | |
|---|---|---|---|
| 2007/0024359 A1* | 2/2007 | Yamaji ................ | H03F 3/45183 330/69 |
| 2007/0026835 A1* | 2/2007 | Yamaji ..................... | H04B 1/30 455/318 |
| 2008/0064359 A1* | 3/2008 | Yamaji ................ | H03F 3/45085 330/252 |
| 2008/0274714 A1 | 11/2008 | Yamaji et al. | |

* cited by examiner

*Primary Examiner* — William Hernandez
(74) *Attorney, Agent, or Firm* — Condo Roccia Koptiw LLP (57) ABSTRACT

Described are an amplifier circuits, systems, and methods for amplifying a plurality of sinusoid signals having a relative phase difference to each other. The amplifier circuit comprises a first sequence of at least three transistor amplifiers, wherein a first terminal of each transistor amplifier of the first sequence is configured to receive one respective signal of the plurality sinusoid signals. The amplifier further comprises a second sequence of at least three transistor amplifiers. A second terminal of each transistor amplifier of the second sequence is connected to a third terminal of one respective transistor amplifier of the first sequence. A first terminal of each transistor amplifier of the second sequence is connected to the third terminal of a next transistor amplifier of the second sequence. The first terminal of a last transistor amplifier is connected to the third terminal of a first transistor amplifier.

20 Claims, 4 Drawing Sheets

AMPLIFIER CIRCUIT FOR AMPLIFYING SINUSOID SIGNALS

CROSS REFERENCE TO RELATED APPLICATIONS

This application claims the benefit of European patent application no. 21216735.7, filed 22 Dec. 22, 2021, the entire contents of which are incorporated by reference herein.

TECHNICAL FIELD

The present invention is generally related to amplifier circuits, and more specifically to amplifier circuits for amplifying sinusoid signals.

BACKGROUND

In radio-frequency, RF, and microwave applications, mixers, or frequency mixers are often used. A mixer, or frequency mixer, is a circuit that produces new frequencies from signals applied to it. In its most common application, two signals are applied to a mixer, and it produces new signals at the sum and difference of the original frequencies. Another application is image rejection mixers, which are commonly used in RF and microwave applications. An image rejection mixer receives signals which are phase-shifted with respect to each other, such as quadrature signals or polyphase signals, and utilizes phasing techniques to cancel out unwanted mix products. An additional application is I/Q-modulator and I/Q-demodulators.

The performance of a mixer, such as an image rejection mixer or an I/Q-(de)modulator, is dependent on the amplitude and phase balance between the signals received by the mixer. The amplitude and phase balance between the signals are frequency dependent, and therefore the performance of a mixer is also frequency dependent.

There is an interest to increase the quality of phase-shifted signals, which may be done by cascading polyphase filters. However, such cascading causes dampening, which in turn adds a need of applying additional amplifier stages. However, each additional amplifier stage may increase the power consumption and/or increase the circuit area of the mixer.

SUMMARY

It is of interest to provide an amplifier circuit for amplifying sinusoid signals which may increase the performance of a mixer without adding loss and/or circuit size.

These interests are met by providing an arrangement having the features in the independent claims. Preferred embodiments are defined in the dependent claims.

Hence, according to a first aspect of the present disclosure, there is provided an amplifier circuit for amplifying a plurality of sinusoid signals, wherein the sinusoid signals have a relative phase difference to each other. The amplifier circuit comprises a first sequence of at least three transistor amplifiers. A first terminal of each transistor amplifier of the first sequence is configured to receive one respective signal of the plurality sinusoid signals. A second terminal of each transistor amplifier of the first sequence is connected to a current source. The amplifier circuit further comprises a second sequence of at least three transistor amplifiers comprising a first transistor amplifier and a last transistor amplifier. A second terminal of each transistor amplifier of the second sequence is connected to a third terminal of one respective transistor amplifier of the first sequence. A third terminal of each transistor amplifier of the second sequence is connected to a supply voltage. A first terminal of each transistor amplifier of the second sequence is connected to the third terminal of a next transistor amplifier of the second sequence. The first terminal of the last transistor amplifier is connected to the third terminal of the first transistor amplifier. The first terminals are bases or gates, the second terminals are emitters or sources, and the third terminals are collectors or drains.

According to a second aspect of the present disclosure, there is provided a system comprising the amplifier circuit according to the first aspect. The system comprises a poly-phase filter circuit configured to output the plurality of sinusoid signals via a plurality of outputs of the poly-phase filter circuit, wherein the sinusoid signals have a relative phase difference to each other. Each first terminal of the transistor amplifiers of the first sequence is connected to a corresponding output of the plurality of outputs of the poly-phase filter circuit.

According to a third aspect of the present disclosure, there is provided an image rejection mixer comprising the system according to the third aspect.

According to a fourth aspect of the present disclosure, there is provided an I/Q-modulator or an I/Q-demodulator comprising the system according to the third aspect.

The present disclosure is based on the concept of using feedback of sinusoid signals having a relative phase difference to each other in order to reduce phase and/or amplitude error of said sinusoid signals. The amplifier circuit may be understood as a modified cascade amplifier. Amplifier circuits are often required in order to drive mixers. By using the amplifier circuit of the present disclosure to provide a reduced phase and/or amplitude error, the performance of a mixer may thereby be increased without having to use additional poly-phase filter and amplifier stages.

The plurality of sinusoid signals may have the same, or substantially the same, frequency.

The first sequence of at least three transistor amplifiers may be understood as a sequence of transistors each in a common-emitter configuration, or as a common-emitter stage. The first sequence may cause a conversion of phase error(s) of the sinusoid signals into amplitude error(s) of the sinusoid signals. However, the first sequence may increase the overall quality of the sinusoid signals with respect to the relative phase difference between them. The performance of the amplifier circuit may be further increased if the sinusoid signals are amplitude matched.

The second sequence of at least three transistor amplifiers may be understood a sequence of transistors each in a current-follower configuration, or as a common-follower stage.

The transistor amplifiers of the first and second sequences may each comprise a single transistor or a plurality of connected transistors. Terminals of a transistor amplifier of the first or second sequence comprising a plurality of connected transistors may be understood as being operable as terminals of a single transistor. Therefore, the terminals of a transistor amplifier comprising a plurality of connected transistors may be operated as a single transistor with respect to its terminals.

The number of transistor amplifiers in the first and second sequences may be equal. Further, the number of transistor amplifiers in each of the first and second sequences may be equal to the number of sinusoid signals of the plurality of sinusoid signals. The second terminals of each transistor amplifier of the first sequence may be connected to a common current source.

By the term "next transistor amplifier of the second sequence" it is meant, for example, a transistor amplifier of the second sequence following, or succeeding, another transistor amplifier of the second sequence. For example, the second sequence may comprise a first, a second, and a third transistor amplifier, and thus the second transistor amplifier would be the next transistor amplifier with respect to the first transistor amplifier, and consequently, the third transistor amplifier would be the next transistor amplifier with respect to the second transistor amplifier. Further, in this example, the third transistor amplifier would be the last transistor amplifier of the second sequence. However, it is to be understood that the present disclosure is not limited to comprising a second sequence comprising three transistor amplifiers, and may comprise any number of transistor amplifiers, such as three, four, five, six, seven, eight, or more.

The connection of a first terminal of each transistor amplifier of the second sequence to a third terminal of a next transistor amplifier of the sequence may be understood as each first terminal of a transistor amplifier of the second sequence receiving feedback from the third terminal of a next transistor amplifier of the second sequence. The feedback connection of the transistor amplifiers of the second sequence may provide amplification of the sinusoid signals without the need for additional amplifier stages and/or an increased circuit size.

The plurality of sinusoid signals may include a sequence of n sinusoid signals. Each sinusoid signal may have a phase difference substantially equal to 360 degrees divided by n relative to the previous sinusoid signal of the sequence of n sinusoid signals. A first sinusoid signal of the sequence of n sinusoid signals may have a phase difference substantially equal to 360 degrees divided by n to a last sinusoid signal of the sequence of n sinusoid signals. Each sinusoid signal of the sequence of n sinusoid signals may have a phase difference relative to a first sinusoid signal of the sequence of n sinusoid signals substantially equal to 360 degrees divided by n times its placement in the sequence minus one. In other words, the plurality of sinusoid signals may be evenly spread out over a period of 360 with regards to phase difference. Thereby, the feedback for reducing phase and/or amplitude error of the sinusoid signals may be improved.

For example, if the plurality of sinusoid signals comprises four sinusoid signals, a first sinusoid signal may be deemed as having no phase difference, and a second sinusoid signal may have a 90 degree phase difference with respect to the first sinusoid signal, since 360 degrees divided by four times is 90 degrees, which is multiplied by one since two minus one equals one. Consequently, a third sinusoid signal may have a 180 degree phase difference with respect to the first sinusoid signal, and a fourth sinusoid signal may have a 270 degree phase difference with respect to the first sinusoid signal.

Each transistor amplifier of the first and/or second sequence may comprise a plurality of connected transistors, which may increase amplification of the sinusoid signals compared to using transistor amplifiers comprising a single transistor.

However, it is to be understood that the present disclosure is not limited to transistor amplifiers comprising a plurality of connected transistors. Transistor amplifiers comprising a single transistor may provide a sufficient amplification of the sinusoid signals, and may use less circuit area, or size, compared to transistor amplifiers comprising a plurality of connected transistors.

Each transistor amplifier of the second sequence may comprise a first transistor, a second transistor and a third transistor. Each transistor, of the first, second and third transistors, may comprise a first terminal which is a base or a gate, a second terminal which is an emitter or a source, and a third terminal which is a collector or a drain. The first terminal of the first transistor may form the second terminal of said transistor amplifier of the second sequence. The second terminal of the first transistor may be connected to the third terminal of the respective transistor amplifier of the first sequence. The second terminal of the second transistor may be connected to the first terminal of the first transistor. The second terminal of the third transistor may be connected to the third terminal of the first transistor. The first terminals of the second and third transistors may be connected, thereby forming the first terminal of said transistor amplifier of the second sequence. The third terminals of the second and third transistors may be connected, thereby forming the third terminal of said transistor amplifier of the second sequence. The above-described configuration may provide an increased amplification of the sinusoid signals compared to using transistor amplifiers comprising a single transistor.

For at least one of the first sequence and the second sequence, the first terminals may be bases, the second terminals may be emitters, and the third terminals may be collectors. Thus, the transistor amplifiers of the first and/or the second sequence may be configured as bipolar junction transistors, BJTs. At least one, or each, transistor amplifier may comprise a BJT. A BJT may be configured as a heterojunction bipolar transistor, HBT.

For at least one of the first sequence and the second sequence, the first terminals may be gates, the second terminals may be sources, and the third terminals may be drains. Thus, the transistor amplifiers of the first and/or the second sequence may be configured as field-effect transistors, FETs. At least one each transistor amplifier comprises a FET. A FET may be configured as a metal-oxide-semiconductor FET, MOSFET.

The first sequence and the second sequence may comprise FETs, or BJTs. Alternatively, the first sequence may comprise FETs, and the second sequence may comprise BJTs. In yet another alternative, the first sequence may comprise BJTs, and the second sequence may comprise FETs.

The third terminal of each transistor amplifier of the second sequence may be connected to the supply voltage via an impedance. The impedance may comprise a resistor, and/or an inductance. However, the impedance may be replaced by an active electrical component or circuit, or a current-dependent voltage source.

The third terminal of each transistor amplifier of the second sequence may be connected to the supply voltage via a transimpedance. The first terminal of each transistor amplifier of the second sequence may be connected to the third terminal of a next transistor amplifier of the second sequence via the transimpedance to which said third terminal of a next transistor amplifier of the second sequence is connected. In other words, the first terminal of a transistor amplifier of the second sequence and the third terminal of the next transistor amplifier may both be connected to a transimpedance which is connected to the supply voltage. A transimpedance may, for example, be understood as a generalization of a circuit which is able to convert the output current from the third terminals of the transistor amplifiers of the second sequence to a control voltage at the first terminals of the transistor amplifiers of the second sequence. A disadvantage with using a simple impedance may be that the current at a first terminal of a transistor amplifier of the second sequence may be too low due control said transistor amplifier of the second sequence in an efficient manner. By using a transimpedance, rather than a simple impedance, said disadvantage may be overcome.

The plurality of sinusoid signals may be a plurality of polyphase signals or a plurality of quadrature signals.

BRIEF DESCRIPTION OF THE DRAWINGS

The present disclosure will now be described in more detail, with reference to the appended drawings showing embodiment(s) of the disclosure.

DETAILED DESCRIPTION

Figure 1:
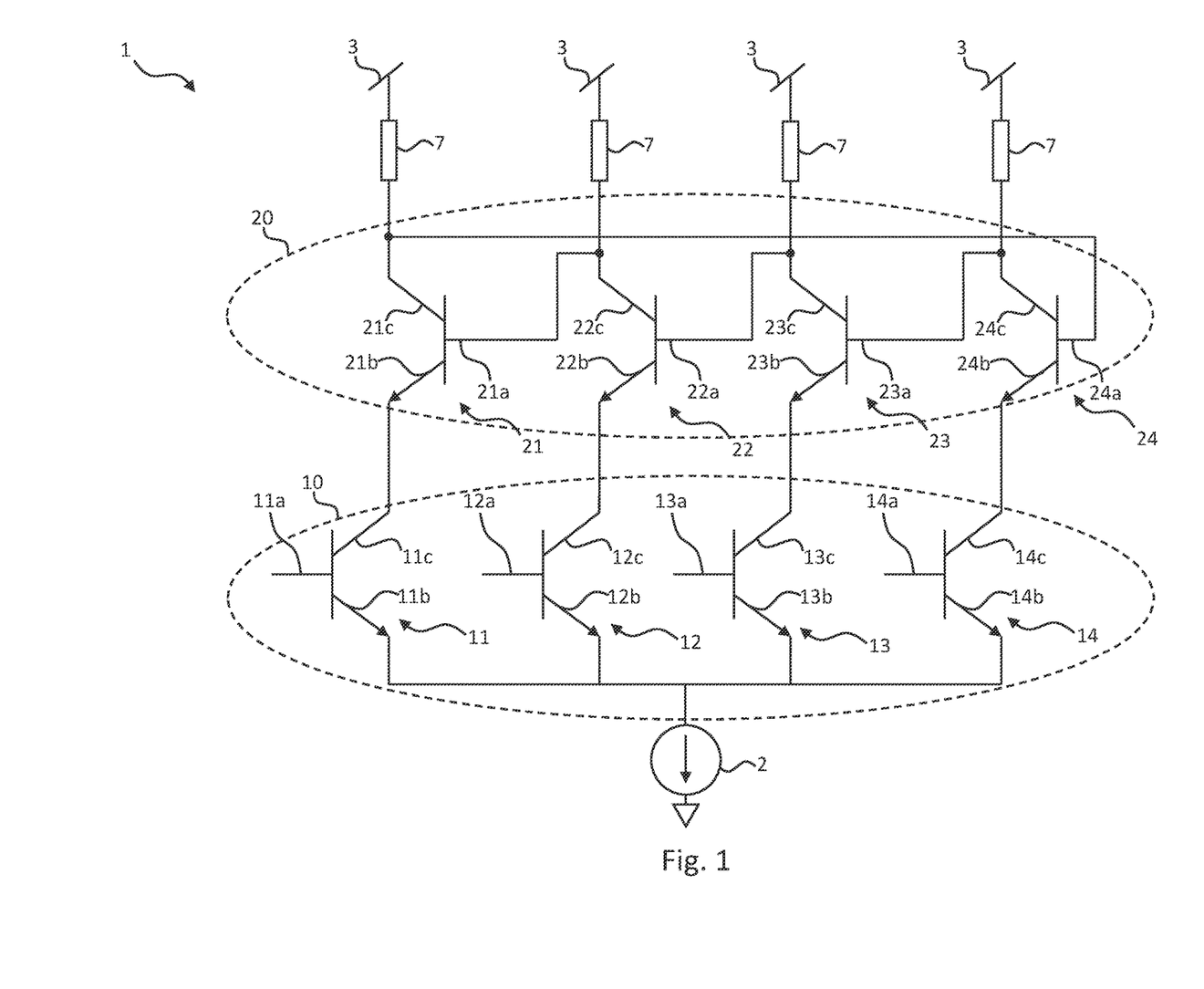
FIG. 1 schematically shows an amplifier circuit according to an exemplifying embodiment of the present disclosure.

FIG. 1 schematically shows an amplifier circuit 1 for amplifying sinusoid signals according to an exemplifying embodiment of the present disclosure.

The amplifier circuit 1 comprises a first sequence 10 of four transistor amplifiers 11-14. A first terminal 11a-14a of each transistor amplifier 11-14 of the first sequence 10 is configured to receive one respective signal of the plurality of sinusoid signals. A second terminal 11b-14b of each transistor amplifier 11-14 of the first sequence 10 is connected to a current source 2, which is common to all of the second terminals 11b-14b. However, each second terminal 11b-14b may alternatively be connected to a respective current source 2.

The amplifier circuit 1 further comprises a second sequence 20 of four transistor amplifiers 21-24. One of the transistor amplifiers 21 of the second sequence may be understood as a first transistor amplifier 21, and another of the transistor amplifiers 24 of the second sequence may be understood as a last transistor amplifier 24. A second terminal 21b-24b of each transistor amplifier 21-24 of the second sequence 20 is connected to a third terminal 11c-14c of one respective transistor amplifier 11-14 of the first sequence 10. A third terminal 21c-24c of each transistor amplifier 21-24 of the second sequence 20 is connected to a supply voltage 3, wherein the third terminal 21c-24c of each transistor amplifier 21-24 of the second sequence 20 is connected to the supply voltage 3 via an impedance 7. A first terminal 21a-23a of each transistor amplifier 21-23 of the second sequence 20 except the last one is connected to the third terminal 22c-24c of a next transistor amplifier 22-24 of the second sequence 20. The first terminal 24a of the last transistor amplifier 24 is connected to the third terminal 21c of the first transistor amplifier 21.

Output of the amplifier circuit 1 may be taken from the third terminals 21c-24c of the transistor amplifiers 21-24 of the second sequence 20.

The first terminals 11a-14a, 21a-24a are bases or gates, the second terminals 11b-14b, 21b-24b are emitters or sources, and the third terminals 11c-14c, 21c-24c are collectors or drains.

The transistor amplifiers 11-14, 21-24 are each depicted as a transistor, and the first terminals 11a-14a, 21a-24a are bases, the second terminals 11b-14b, 21b-24b are emitters, and the third terminals 11c-14c, 21c-24c are collectors. The transistors depicted in FIG. 1 are depicted as bipolar junction transistors, BJTs. However, it is to be understood that some, or all, of the transistor amplifiers 11-14, 21-24 may be field-effect transistors, FETs, and consequently for the FETs, the first terminals 11a-14a, 21a-24a may be gates, the second terminals 11b-14b, 21b-24b may be sources, and the third terminals 11c-14c, 21c-24c may be drains.

The above-described configuration of transistor amplifiers 11-14, 21-24 may be understood as a 4-port configuration. However, the present disclosure is not limited to such a configuration. For example, the first and second sequences 10, 20 may comprise additional connected transistor amplifiers, which may together with the transistor amplifiers 11-14, 21-24 form, for example, a 6-port, or 8-port, configuration.

Figure 2:
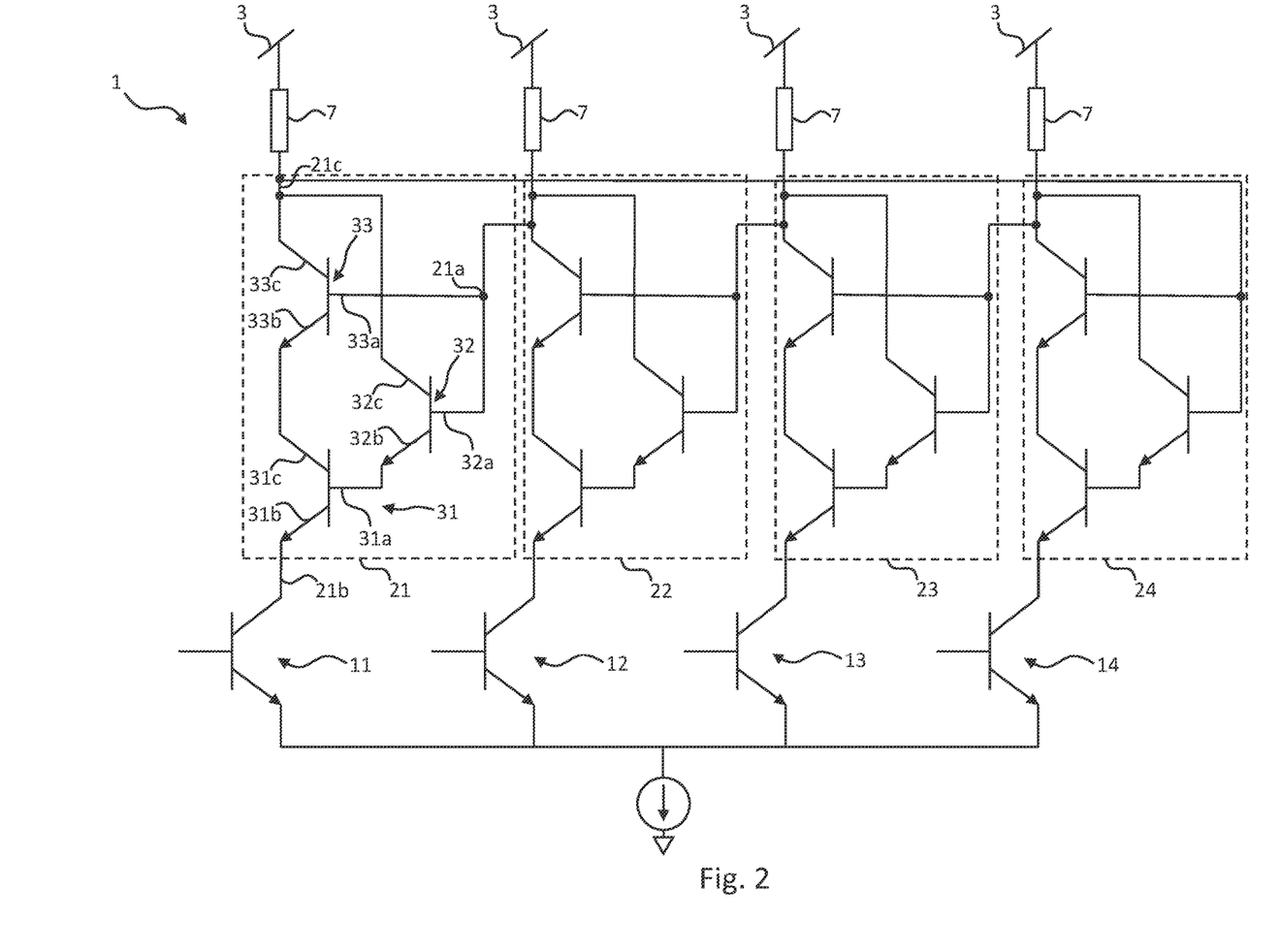
FIG. 2 schematically shows an amplifier circuit according to an exemplifying embodiment of the present disclosure.

FIG. 2 schematically shows an amplifier circuit 1 according to an exemplifying embodiment of the present disclosure. It should be noted that FIG. 2 comprises features, elements and/or functions as shown in FIG. 1 and described in the associated text. Hence, it is also referred to FIG. 1 and the description relating thereto for an increased understanding.

A difference between the amplifier circuit 1 shown in FIG. 1 and the embodiment shown in FIG. 1 is that each transistor amplifier 21-24 of the second sequence 20 comprises a plurality of interconnected transistors 31-33.

The transistor amplifiers 21-24 of the second sequence are substantially identical. For an increased level of legibility, only the first transistor amplifier 21 in FIG. 2 has reference numerals. However, it is to be understood that the remaining transistor amplifiers 22-24 comprise substantially identical components and features as the first transistor amplifier 21.

The first transistor amplifier 21 comprises a first transistor 31, a second transistor 32 and a third transistor 33. The first, second and third transistors 31-33 each comprises a first terminal 31a-33a which is a base or a gate, a second terminal 31b-33b which is an emitter or a source, and a third terminal 31c-33c which is a collector or a drain.

The second terminal 31b of the first transistor 31 forms the second terminal 21b of the first transistor amplifier 21 of the second sequence 20. The second terminal 31b of the first transistor 31 is connected to the third terminal 11c of the respective transistor amplifier 11 of the first sequence 10. The second terminal 32b of the second transistor 32 is connected to the first terminal 31a of the first transistor 31. The second terminal 33b of the third transistor 33 is connected to the third terminal 31c of the first transistor 31. The first terminals 32a, 33a of the second and third transistors 32, 33 are interconnected, thereby forming the first terminal 21a of the first transistor amplifier 21 of the second sequence 20. The third terminals 32c, 33c of the second and third transistors 32, 33 are interconnected, thereby forming the third terminal 21c of the first transistor amplifier 21 of the second sequence 20.

Figure 3:
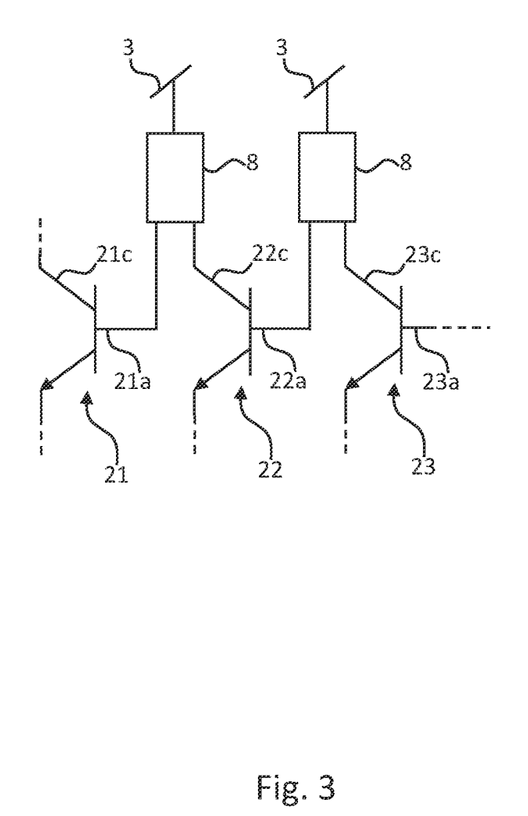
FIG. 3 schematically shows transistor amplifiers of an amplifier circuit according to an exemplifying embodiment of the present disclosure.

FIG. 3 schematically shows transistor amplifiers 21-23 of an amplifier circuit according to an exemplifying embodiment of the present disclosure. The entire amplifier circuit is not shown in FIG. 3. However, the amplifier circuit may be similar, or substantially identical, to any one of the amplifier circuits shown in FIG. 1 or 2 and described in the associated texts, except for some differences which will be discussed in the following.

FIG. 3 shows a portion of a second sequence of transistor amplifiers 21-23 of the amplifier circuit. The portion shows a first transistor amplifier 21, a second transistor amplifier 22, and a third transistor amplifier 23. However, it is to be understood that the present disclosure is not limited to a second sequence comprising three transistor amplifiers 21-23, but encompasses that the second sequence may comprise more than three transistor amplifiers 21-23 as well.

Each of the shown transistor amplifiers 21-23 comprises a transistor comprising a first terminal 21a, 22a, 23a, a second terminal 21b, 22b, 23b, and a third terminal 21c, 22c, 23c. The third terminals 22c, 23c of the second and third transistor amplifiers 22, 23 are connected to the supply voltage 3 via a transimpedance 8. Further, the first terminal 21a, 22a of the first and second transistor amplifiers 21, 22 are connected to the third terminals 22c, 23c of the next transistor amplifiers 22, 23, i.e. the second and third transistor amplifiers 22, 23, via the transimpedance 8 to which the third terminal 22c, 23c of the next transistor amplifier 22, 23 are connected. In other words, the first terminal 21a, 22a of a transistor amplifier 21, 22 and the third terminal 22c, 23c of the next transistor amplifier 22, 23 are both connected to the transimpedance 8. Consequently, the first terminal 21a, 22a of a transistor amplifier 21, 22 and the third terminal 22c, 23c of the next transistor amplifier 22, 23 are both connected to supply voltage 3 via the transimpedance 8.

The transistor amplifiers 21-23 may alternatively comprise a plurality of connected transistors, for example as shown in FIG. 2.

It is to be understood that the third terminal 21c of the first transistor amplifier 21 and the first terminal 23a of the third transistor amplifier 23 are also connected to transimpedances (not shown). If the amplifier circuit only comprises the three shown transistor amplifiers 21-23, then the third terminal 21c of the first transistor amplifier 21 and the first terminal 23a of the third transistor amplifier 23 would be connected to the same transimpedance (not shown).

Figure 4:
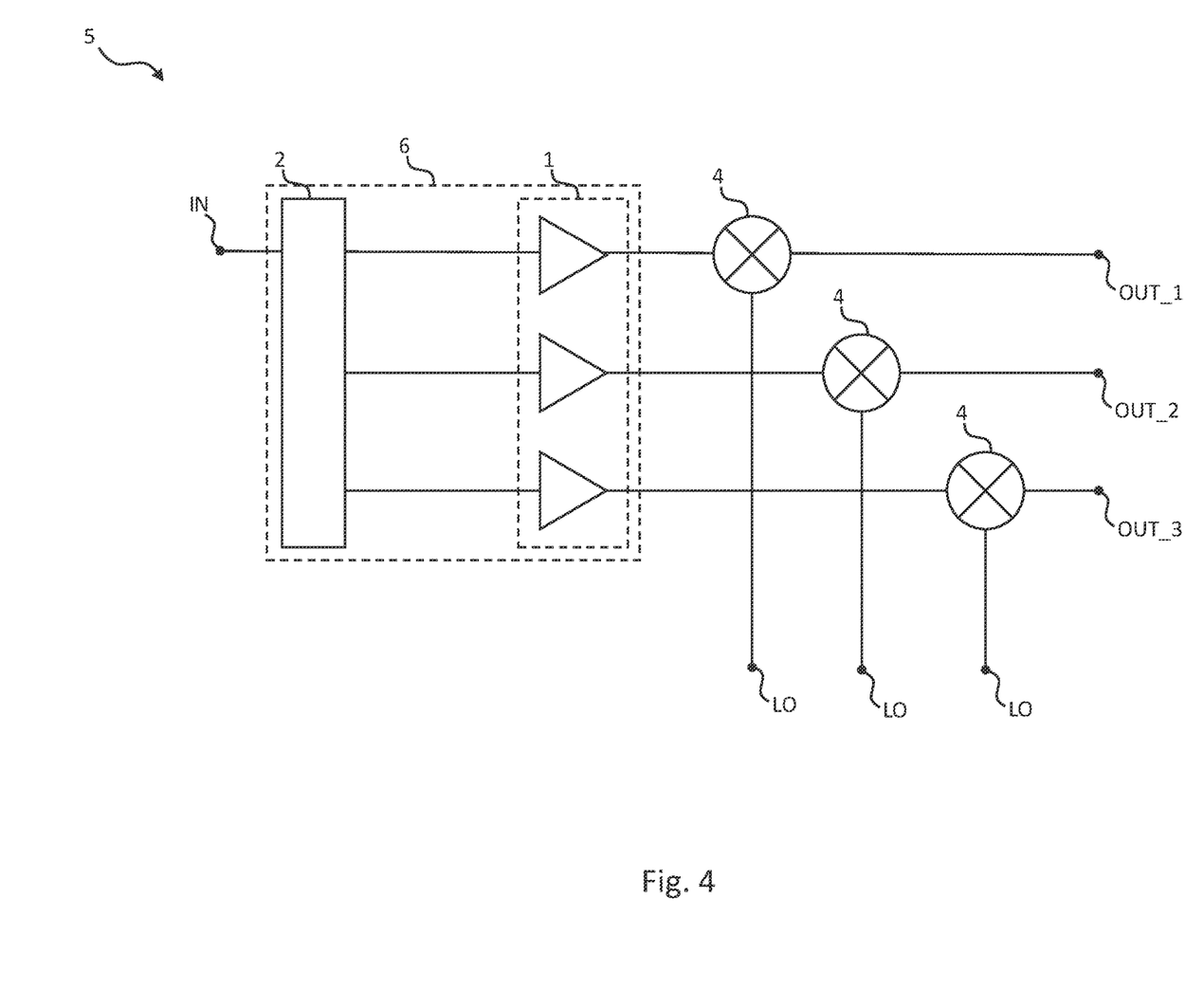
FIG. 4 schematically shows a mixer according to an exemplifying embodiment of the present disclosure.

FIG. 4 schematically shows a mixer 5 according to an exemplifying embodiment of the present disclosure. The mixer 5 may be configured as an image rejection mixer, an I/Q-modulator or an I/Q-demodulator. The mixer 5 comprises a system 6 comprising an amplifier circuit 1 according to an exemplifying embodiment of the present invention and a poly-phase filter circuit 2.

The poly-phase filter circuit 2 is configured to output a plurality of sinusoid signals via a plurality of outputs of the poly-phase filter circuit 2, wherein the sinusoid signals have a relative phase difference to each other. The poly-phase filter circuit 2 has an input, IN, configured to receive an input signal, which may be a sinusoid signal. The poly-phase filter circuit 2 may be configured to split the input signal into the plurality of sinusoid signals having a relative phase difference to each other. The plurality of sinusoid signals may be a plurality of polyphase signals or a plurality of quadrature signals. The poly-phase filter circuit 2 may be configured to split the input signal into a number of sinusoid signals, wherein the number may be an even number. However, the poly-phase filter circuit 2 may have one or more additional inputs, configured to receive one or more addition input signal(s). The shown poly-phase filter circuit 2 in FIG. 4 comprises three outputs. However, the poly-phase filter circuit 2 may comprise substantially any number of outputs, and is not limited to the exemplary embodiment as shown in FIG. 4.

The amplifier circuit 1 is connected to the outputs of the poly-phase filter circuit 2. Therefore, it may be understood that the amplifier circuit 1 shown in FIG. 4 comprises first and second sequences, wherein each sequence comprises three transistor amplifiers. Further, the three outputs of the poly-phase filter circuit 2 may be understood as being connected to a respective first terminal of a respective transistor amplifier of the first sequence of the amplifier circuit 1. Furthermore, it is to be understood that the first terminals of each transistor amplifier of the second sequence is connected to the third terminal of the next transistor amplifier of the second sequence, and that the first terminal of the last transistor amplifier is connected to the third terminal of the first transistor amplifier.

Outputs from the amplifier circuit 1, which are taken from the third terminals of the transistor amplifiers of the second sequence, are each connected to a frequency mixer 4. Further, a local oscillator signal LO is connected to each frequency mixer 4. The local oscillator signals LO may have a relative phase difference with respect to each other, wherein the relative phase difference may be substantially the same as the relative phase difference between the sinusoid signals output by the poly-phase filter circuit 2. Alternatively, the local oscillator signals LO may be substantially identical.

The output signals OUT_1-3 from the frequency mixers 4 may be understood as the output of the mixer 5. However, the mixer 5 may comprise additional components to which output the output signals from the frequency mixers 4 may be connected. Such additional components may comprise, but are not limited to, for example, a filter, such as a band-pass filter.

The person skilled in the art realizes that the present disclosure by no means is limited to the preferred embodiments described above. On the contrary, many modifications and variations are possible within the scope of the appended claims.

The invention claimed is:

1. An amplifier circuit configured to amplify a plurality of sinusoid signals, wherein the sinusoid signals have a relative phase difference to each other, the amplifier circuit comprising:
   a first sequence of at least three transistor amplifiers, wherein:
      a first terminal of each transistor amplifier of the first sequence is configured to receive one respective signal of the plurality of sinusoid signals; and
      a second terminal of each transistor amplifier of the first sequence is connected to a current source;
   a second sequence of at least three transistor amplifiers comprising a first transistor amplifier and a last transistor amplifier, wherein:
      a second terminal of each transistor amplifier of the second sequence is connected to a third terminal of one respective transistor amplifier of the first sequence;
      a third terminal of each transistor amplifier of the second sequence is connected to a supply voltage; and
      a first terminal of each transistor amplifier of the second sequence is connected to the third terminal of a next transistor amplifier of the second sequence;
   wherein the first terminal of the last transistor amplifier is connected to the third terminal of the first transistor amplifier; and
   wherein the first terminals are bases or gates, the second terminals are emitters or sources, and the third terminals are collectors or drains.

2. The amplifier circuit of claim 1, wherein the plurality of sinusoid signals includes a sequence of n sinusoid signals, wherein:
   each sinusoid signal has a phase difference substantially equal to 360 degrees divided by n relative to the previous sinusoid signal of the sequence of n sinusoid signals, and
   a first sinusoid signal of the sequence of n sinusoid signals has a phase difference substantially equal to 360 degrees divided by n to a last sinusoid signal of the sequence of n sinusoid signals.

3. The amplifier circuit of claim 1, wherein each transistor amplifier of the second sequence comprises a plurality of connected transistors.

4. The amplifier circuit of claim 1, wherein each transistor amplifier of the second sequence comprises a first transistor, a second transistor, and a third transistor, each transistor thereof comprising a first terminal which is a base or a gate, a second terminal which is an emitter or a source, and a third terminal which is a collector or a drain; wherein:
   the second terminal of the first transistor forms the second terminal of said transistor amplifier of the second sequence;
   the second terminal of the first transistor is connected to the third terminal of the respective transistor amplifier of the first sequence;
   the second terminal of the second transistor is connected to the first terminal of the first transistor;
   the second terminal of the third transistor is connected to the third terminal of the first transistor;
   the first terminals of the second and third transistors are connected, thereby forming the first terminal of said transistor amplifier of the second sequence; and
   the third terminals of the second and third transistors are connected, thereby forming the third terminal of said transistor amplifier of the second sequence.

5. The amplifier circuit of claim 1, wherein, for at least one of the first sequence and the second sequence, the first terminals are bases, the second terminals are emitters, and the third terminals are collectors.

6. The amplifier circuit of claim 5, wherein each transistor amplifier comprises a bipolar junction transistor (BJT).

7. The amplifier circuit of claim 1, wherein, for at least one of the first sequence and the second sequence, the first terminals are gates, the second terminals are sources, and the third terminals are drains.

8. The amplifier circuit of claim 7, wherein each transistor amplifier comprises a field-effect transistor (FET).

9. The amplifier circuit of claim 1, wherein the third terminal of each transistor amplifier of the second sequence is connected to the supply voltage via an impedance.

10. The amplifier circuit of claim 1, wherein the third terminal of each transistor amplifier of the second sequence is connected to the supply voltage via a transimpedance.

11. The amplifier circuit of claim 10, wherein the first terminal of each transistor amplifier of the second sequence is connected to the third terminal of a next transistor amplifier of the second sequence via the transimpedance to which said third terminal of a next transistor amplifier of the second sequence is connected.

12. The amplifier circuit of claim 1, wherein the third terminal of each transistor amplifier of the second sequence is configured to provide an output of the amplifier circuit.

13. The amplifier circuit of claim 1, wherein the plurality of sinusoid signals is a plurality of polyphase signals.

14. The amplifier circuit of claim 1, wherein the plurality of sinusoid signals is a plurality of quadrature signals.

15. A system comprising:
an amplifier circuit configured to amplify a plurality of sinusoid signals, wherein the sinusoid signals have a relative phase difference to each other, the amplifier circuit comprising:
   a first sequence of at least three transistor amplifiers, wherein:
      a first terminal of each transistor amplifier of the first sequence is configured to receive one respective signal of the plurality of sinusoid signals; and
      a second terminal of each transistor amplifier of the first sequence is connected to
   a current source;
   a second sequence of at least three transistor amplifiers comprising a first transistor amplifier and a last transistor amplifier, wherein:
      a second terminal of each transistor amplifier of the second sequence is connected to a third terminal of one respective transistor amplifier of the first sequence;
      a third terminal of each transistor amplifier of the second sequence is connected to a supply voltage;
      a first terminal of each transistor amplifier of the second sequence is connected to the third terminal of a next transistor amplifier of the second sequence;
   wherein the first terminal of the last transistor amplifier is connected to the third terminal of the first transistor amplifier; and
   wherein the first terminals are bases or gates, the second terminals are emitters or sources, and the third terminals are collectors or drains; and
a poly-phase filter circuit configured to output the plurality of sinusoid signals via a plurality of outputs of the poly-phase filter circuit, wherein the sinusoid signals have a relative phase difference to each other, and wherein each first terminal of the transistor amplifiers of the first sequence is connected to a corresponding output of the plurality of outputs of the poly-phase filter circuit.

16. A mixer comprising:
a system comprising:
   an amplifier circuit configured to amplify a plurality of sinusoid signals, wherein the sinusoid signals have a relative phase difference to each other, the amplifier circuit comprising:
      a first sequence of at least three transistor amplifiers, wherein:
         a first terminal of each transistor amplifier of the first sequence is configured to receive one respective signal of the plurality of sinusoid signals; and
         a second terminal of each transistor amplifier of the first sequence is connected to
      a current source;
      a second sequence of at least three transistor amplifiers comprising a first transistor amplifier and a last transistor amplifier, wherein:
         a second terminal of each transistor amplifier of the second sequence is connected to a third terminal of one respective transistor amplifier of the first sequence; wherein
         a third terminal of each transistor amplifier of the second sequence is connected to a supply voltage; wherein a first terminal of each transistor amplifier of the second sequence is connected to the third terminal of a next transistor amplifier of the second sequence;

wherein the first terminal of the last transistor amplifier is connected to the third terminal of the first transistor amplifier; and wherein the first terminals are bases or gates, the second terminals are emitters or sources, and the third terminals are collectors or drains, a poly-phase filter circuit configured to output the plurality of sinusoid signals via a plurality of outputs of the poly-phase filter circuit, wherein the sinusoid signals have a relative phase difference to each other, and wherein each first terminal of the transistor amplifiers of the first sequence is connected to a corresponding output of the plurality of outputs of the poly-phase filter circuit; and a filter.

17. The mixer of claim 16, wherein the mixer is an image rejection mixer.

18. The mixer of claim 16, wherein the mixer is an I/Q-modulator.

19. The mixer of claim 16, wherein the mixer is an I/Q-demodulator.

20. The mixer of claim 16, further comprising a plurality of frequency mixers, and wherein the third terminals of the transistor amplifiers of the second sequence, are each connected to a respective frequency mixer of said plurality of frequency mixers, wherein each frequency mixer is configured to receive a local oscillator signal.

* * * * *